(12) United States Patent
Ahn

(10) Patent No.: US 6,337,254 B1
(45) Date of Patent: Jan. 8, 2002

(54) METHOD OF FORMING TRENCH ISOLATION STRUCTURE WITH DUMMY ACTIVE REGIONS AND OVERLYING DISCRIMINATELY DOPED CONDUCTION LAYER

(75) Inventor: Jae-Gyung Ahn, Cheongju (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/286,670

(22) Filed: Apr. 6, 1999

(30) Foreign Application Priority Data

Jun. 5, 1998 (KR) .......................................... 98-280886

(51) Int. Cl.$^7$ ............................................. H01L 21/76
(52) U.S. Cl. ........................ 438/424; 438/218; 438/221; 438/585
(58) Field of Search ................................ 438/218, 221, 438/424, 427, 428, 435, 436, 438, 400, 585, 684

(56) References Cited

U.S. PATENT DOCUMENTS

| | | | |
|---|---|---|---|
| 4,740,480 A | * | 4/1988 | Ooka .......................... 437/61 |
| 4,836,885 A | | 6/1989 | Breiten et al. |
| 5,362,669 A | | 11/1994 | Boyd et al. |
| 6,130,139 A | * | 10/2000 | Ukeda et al. ............... 438/424 |

* cited by examiner

*Primary Examiner*—Matthew Smith
*Assistant Examiner*—Craig P. Lytle
(74) *Attorney, Agent, or Firm*—Birch, Stewart, Kolasch & Birch, LLP

(57) ABSTRACT

A device isolation structure and a method thereof including a semiconductor substrate wherein a field isolation region including a plurality of dummy active regions and an active region are defined, a plurality of trenches formed among the regions, a filling layer filled in the plurality of trenches, a gate insulation layer formed on the semiconductor substrate having the filling layer, and a second conduction layer formed on the gate insulation layer, is capable of preventing a dishing from being generated in etching by forming the plurality of dummy active regions in the field isolation region and basically preventing the wide trenches from being formed, minimizing a parasitic capacitance generated in the dummy active-gate insulation layer-gate insulation layer in the field isolation region, and simplifying an isolation process by using the dummy active pattern.

6 Claims, 4 Drawing Sheets

METHOD OF FORMING TRENCH ISOLATION STRUCTURE WITH DUMMY ACTIVE REGIONS AND OVERLYING DISCRIMINATELY DOPED CONDUCTION LAYER

BACKGROUND OF THE INVENTION

1. Field of the Invention

The present invention is directed to a semiconductor device and a method for fabricating the same, and in particular to a device isolation structure including a wide trench isolation structure and a fabrication method therefor.

2. Description of the Background Art

FIGS. 1A to 1E depict a conventional device isolation method for a semiconductor device.

As illustrated in FIG. 1A, a first silicon insulation layer 2 and a polycrystalline silicon layer 3 are sequentially formed on a semiconductor substrate 1, wherein a device formation region (or active region) 1a and a field isolation region 1b are defined.

As shown in FIG. 1B, the first silicon insulation layer 2 and the polycrystalline silicon layer 3 are etched and patterned such that an upper portion of the semiconductor substrate 1 corresponding to the field isolation region 1b can be exposed. The patterned first silicon insulation layer 2 and polycrystalline silicon layer 3 are utilized as a mask to selectively etch the exposed semiconductor substrate 1, thereby forming a plurality of wide trenches 4.

As illustrated in FIG. 1C, the surfaces of the plurality of trenches 4 and the polycrystalline silicon layer 3 are thermally oxidized, a second silicon insulation layer (not shown) is formed on their upper portion, and then a third silicon insulation layer (filling layer) 5 is formed on the second silicon insulation layer by a chemical vapor deposition so as to fill each trench. At this time, a surface of the filling layer 5 corresponding to the plurality of trenches 4 is caved.

As shown in FIG. 1D, the filling layer 5 within the trenches 4 is partially removed by a chemical-mechanical polishing or an etchback until an upper portion of the polycrystalline silicon layer 3 is exposed.

As illustrated in FIG. 1E, the polycrystalline silicon layer 3 and the first silicon insulation layer 2 are sequentially removed so that only the filling layer 5 remains in the respective trenches 4.

The conventional device isolation method has disadvantages. For instance, when forming devices having wide trenches into which a filling layer is deposited to fill in the wide trenches, and the filling layer becomes caved forming a dish-like shape if the filling layer is etched to make the surface of the semiconductor substrate level. As such, subsequently formed layers must be used to fill the caved shape filling layer, causing problems, particularly when the materials of the subsequently formed layers result in increased parasitic capacitance.

SUMMARY OF THE INVENTION

The present invention is directed to system that substantially obviates one or more of the problems experienced due to the above and other limitations and disadvantages of the related art.

It is an object of the present invention to prevent wide trenches by forming a dummy active pattern at an initial stage in a field isolation region in which the trenches will be formed.

It is another object of the present invention to make a capacitance of a parasitic capacitor, which is formed between a dummy active line and an active line in a field isolation region, similar to a capacitance of a parasitic capacitor in a conventional field isolation region.

Other and further objects, features and advantages of the present invention will be set forth in the description that follows, and in part will become apparent from the detailed description, or may be learned by practice of the invention.

To achieve these and other advantages and in accordance with the purpose of the present invention, as embodied and broadly described, the present invention includes a device isolation structure, including: a semiconductor substrate wherein a field isolation region including a plurality of dummy active regions and an active region are defined; a plurality of trenches formed among the regions; a filling layer filled in the trenches; a gate insulation layer formed on the semiconductor substrate having the filling layer; and a second conduction layer formed on the gate insulation layer.

In addition, in order to achieve the above-described objects of the present invention, there is provided a device isolation method for a semiconductor device, including: sequentially forming a first insulation layer and a first conduction layer on a semiconductor substrate wherein a field isolation region having dummy active regions and an active region are defined; etching and patterning the first insulation layer and the first conduction layer so that an upper portion of the semiconductor substrate on which trenches will be formed can be exposed; forming a plurality of trenches by using the patterned first insulation layer and first conduction layer as a mask and by etching the exposed semiconductor substrate; forming a filling layer on the first conduction layer including the plurality of trenches in order to be filled in the trenches; etching the filling layer until an upper portion of the first conduction layer is exposed; removing the first insulation layer and the first conduction layer so that the filling layer can remain only in the plurality of trenches; forming a gate insulation layer on the semiconductor and the filling layer filled in the plurality of trenches; and forming a second conduction layer on the gate insulation layer.

It is to be understood that both the foregoing general description and the following detailed description are exemplary and explanatory and are intended to provide further explanation of the invention as claimed. Thus, it should be understood that the detailed description and specific examples, while indicating preferred embodiments of the invention, are given by way of example only. Various changes and modifications that are within the spirit and scope of the invention will become apparent to those skilled in the art from this detailed description. In fact, other objects, features and characteristics of the present invention; methods, operation, and functions of the related elements of the structure; combinations of parts; and economies of manufacture will surely become apparent from the following detailed description of the preferred embodiments and accompanying drawings, all of which form a part of this specification, wherein like reference numerals designate corresponding parts in various figures.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Reference will now be made in detail to the preferred embodiments of the present invention, examples of which are illustrated in the accompanying drawings.

A device isolation structure for a semiconductor device and a method thereof in accordance with the present invention will now be described with reference to the accompanying drawings.

Figure 1A:
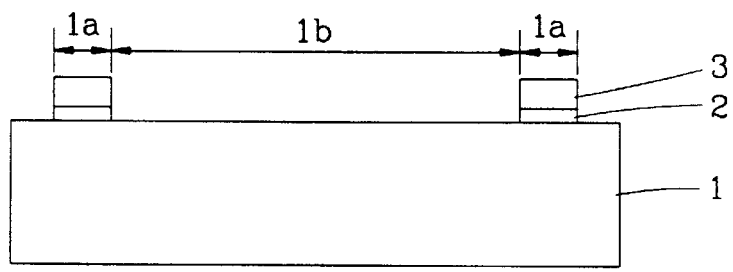
FIGS. 1A to 1E are cross-sectional views sequentially illustrating a conventional device isolation method for a semiconductor device.
Figure 1B:
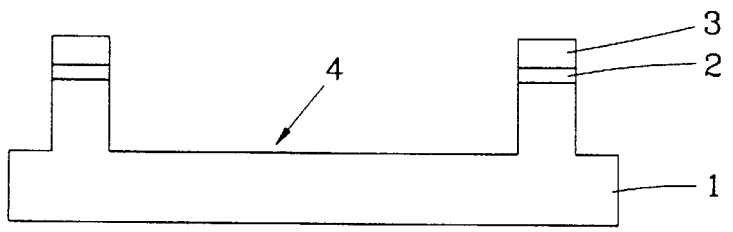
Figure 1C:
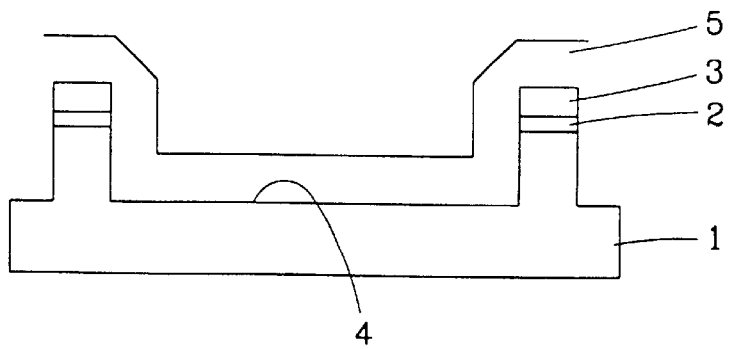
Figure 1D:
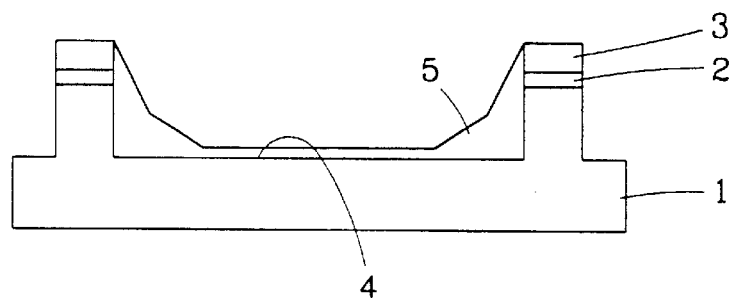
Figure 1E:
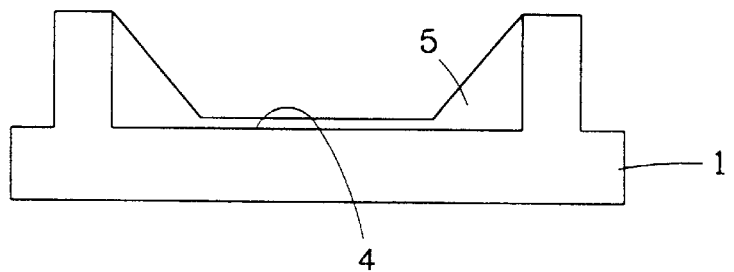
Figure 2:
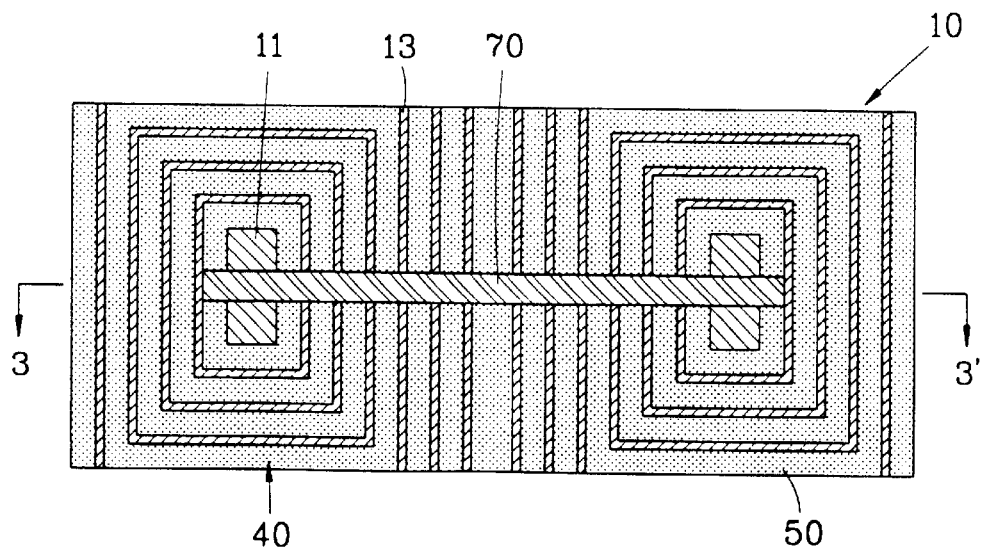
FIG. 2 is a plan view of a device isolation structure for a semiconductor device in accordance with the present invention.
Figure 3:
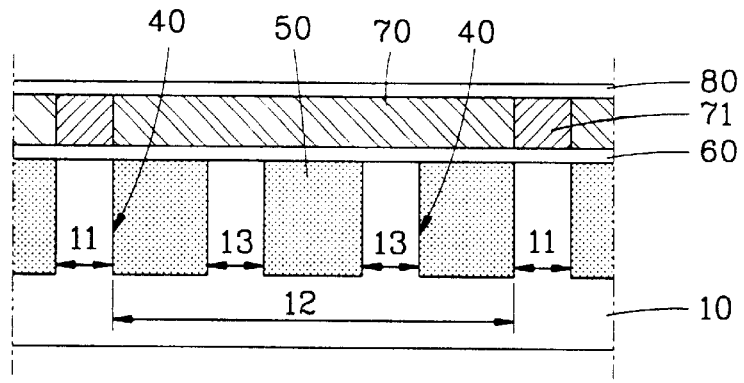
FIG. 3 is a cross-sectional view of the device isolation structure taken along line 3–3' in FIG. 2.

FIGS. 2 and 3 show different views of a semiconductor substrate 10 in which an active region 11 and a field isolation region 12 are defined. The field isolation region 12 has a plurality of dummy active regions 13. A plurality of trenches 40 are formed on the semiconductor substrate 10 among the regions 11, 12, 13. The plurality of trenches are filled with a filling material 50. A gate insulation layer 60 is formed on the filling material 50 and upper portions of the respective regions 11, 12, 13. A gate electrode 71 is formed within a second conduction layer 70 on the gate insulation layer 60.

The second conduction layer 70 is an undoped polycrystalline silicon layer, or a polycrystalline silicon layer that is doped with identical or different impurities.

Reference numeral 80 in FIG. 3 identifies a co-salicide (self-align silicide) layer.

FIGS. 4A to 4E illustrate the device isolation method for the semiconductor device in accordance with the present invention.

Figure 4A:
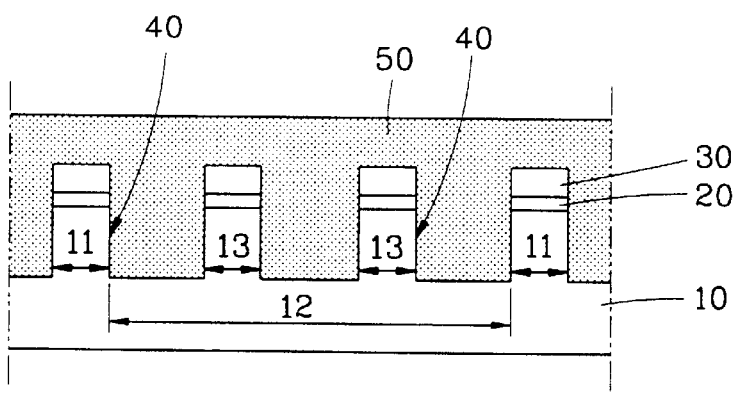
FIGS. 4A to 4E are cross-sectional views sequentially illustrating a device isolation method for the semiconductor device in accordance with the present invention.

First, as shown in FIG. 4A, the first insulation layer 20 and the first conduction layer 30 are sequentially formed on the semiconductor substrate 10, wherein the device formation region (active region) 11 and the field isolation region (having the dummy active regions 13) 12 are defined. Then the first insulation layer 20 and the first conduction layer 30 are etched and patterned so that the portions of the field isolation region 12 not corresponding to the dummy active regions 13 can be exposed. The plurality of trenches 40 are formed to expose portions of the field isolation region 12 by using the patterned first insulation layer 20 and first conduction layer 30 as a mask and by selectively etching the exposed semiconductor substrate 1. The filling layer 50 is formed in the trenches 40 and on the first conduction layer 30 by a chemical vapor deposition. The filling layer 50 is composed of a silicon oxidation layer, a boron phosphorous silicate glass (BPSG), a borosilicate glass (BSG), a phosphosilica glass (PSG), or a combination thereof.

The dummy active regions 13 in the field isolation region 12 serve to basically prevent a wide trench from being formed. Assuming a maximum active layer width A and a minimum active layer width B, the proportion of the dummy active region 13 to the field isolation region 12 is determined by the size of A and B. Additionally, a field isolation region width equal to '2A' corresponds to a maximum width in which the dishing phenomenon does not occur.

Figure 4B:
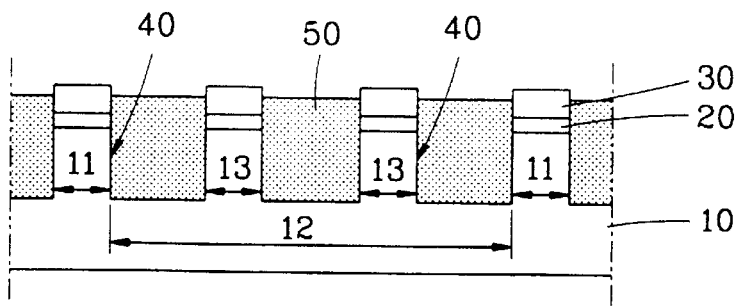

As illustrated in FIG. 4B, a chemical-mechanical polishing or an etchback is carried out on the filling layer 50 until an upper portion of the first conduction layer 30 is exposed.

Figure 4C:
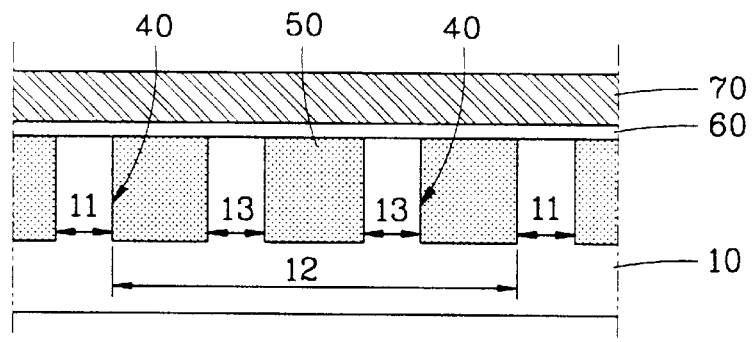

Then, as shown in FIG. 4C, the first conduction layer 30 and the first insulation layer 20 are sequentially removed so that the filling layer 50 can remain in the plurality of trenches 40. Therefore, the semiconductor substrate 10 has an exposed surface that is level with the upper portions of the trenches 40. A second insulation layer 60 (gate insulation layer) is formed on the semiconductor substrate 10 and the filling layer 50 in the plurality of trenches, and a second conduction layer 70 is formed on the gate insulation layer 60. An undoped polycrystalline silicon layer is utilized as the second conduction layer 70.

Figure 4D:
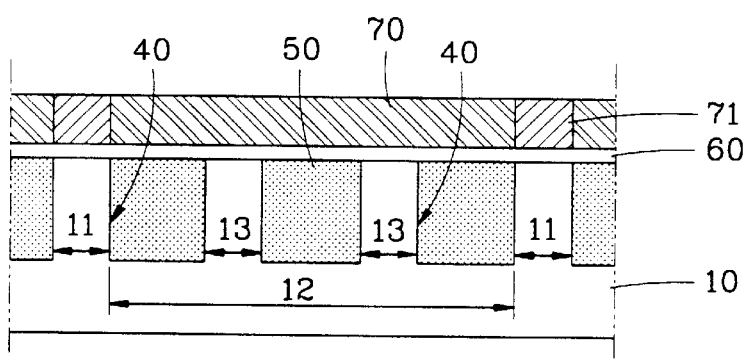

As illustrated in FIG. 4D, a gate electrode 71, which is discriminately doped with an N-type impurity or a P-type impurity by an ion implantation, is formed in the portion of the second conduction layer 70 corresponding to and positioned above the active region 11 in the semiconductor substrate 10.

Figure 4E:
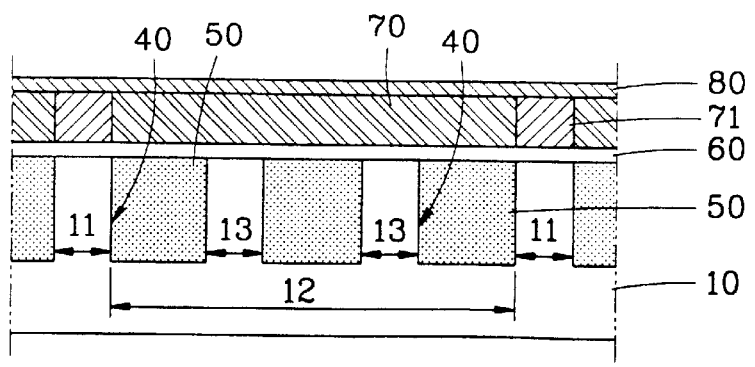

As shown in FIG. 4E, cobalt is formed on the second conduction layer 70, including the gate electrode 71, by the chemical vapor deposition. Then, the co-salicide (self-align silicide) layer 80 is formed by annealing the cobalt. Accordingly, the device isolation method for the semiconductor device in accordance with the present invention is completely carried out.

In the device isolation method according to the present invention, the second conductive layer 70 is formed with an undoped polycrystalline silicon layer to prevent the speed of a circuit from being decreased due to the formation of a parasitic capacitor formed between a gate line and an active line in the field isolation region.

However, although the undoped polycrystalline silicon is utilized, a capacitance of the parasitic capacitor is still greater than a capacitance of the parasitic capacitor in the conventional field isolation region. Therefore, it is preferred to form the field isolation regions between the dummy active regions in order to minimize the size of the undoped polycrystalline region.

The following are examples of how dummy active layers can be used to achieve low parasitic capacitance, particularly when using undoped polycrystalline silicon as the second conduction layer 70 and when the proportionality of the dummy active regions to the field of the field isolation region is adjusted.

If a thickness of the polycrystalline silicon layer (the second conduction layer) is 2000A, a depth of the trench is 3000A, and a thickness of the gate oxidation layer (the second insulation layer) is 50A, the parasitic capacitance is represented in the following three cases as follows.

First, when the dummy active and the doped polycrystalline silicon are used, the parasitic capacitance is obtained by the following equation:

$$Cpara = 3.9 * 8.854e - \frac{14 \text{ F/cm}}{50 * 1e - 8 \text{ cm}} \quad (1)$$

$$= 6.91e - 7 \text{ F/cm}^2$$

$$= 6.91 \text{ fF}/\mu m^2.$$

Second, when the dummy active and the undoped polycrystalline silicon are utilized, the parasitic capacitance is obtained by the following equation;

$$C_{para} = 11.8 * 8.854e - \frac{14 \text{ F/cm}}{2000 * 1e - 8 \text{ cm}} \quad (2)$$

$$= 5.22e - 8 \text{ F/cm}^2$$

$$= 0.522 \text{ fF/}\mu\text{m}^2.$$

Third, when the dummy active and the undoped crystalline are used and the proportion of the dummy active to the field in the field isolation region is set to be 1 to 8 (in the case of a 0.25μ fabrication technique using as a filling material an oxidation layer which is deposited by a high-temperature/low-pressure chemical vapor deposition), the parasitic capacitance is represented by the following equation;

$$C_{para} = 3.9 * 8.854e - \frac{14 \text{ F/cm}}{3000 * 1e - 8 \text{ cm}} * 8/9 + \quad (3)$$

$$11.8 * 8.854e - \frac{14 \text{ F/cm}}{2000 * 1e - 8 \text{ cm}} * 1/9$$

$$= 1.60e - 8 \text{ F/cm}^2$$

$$= 0.160 \text{ fF/}\mu\text{m}^2.$$

As stated above, the device isolation method for the semiconductor device in accordance with the present invention has an advantage in that the dishing phenomenon is not generated due to the formation of plural dummy active regions in the field isolation region, effectively preventing the wide trenches from being formed. Also, the capacitance of the parasitic capacitor which is generated in the dummy active-gate insulation layer-gate elcetrode of the field isolation region can be minimized. Further, the isolation process is simplified by using the dummy active pattern.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claims. Therefore all changes and modifications that fall within the meets and bounds of the claims, or equivalences of such meets and bounds are therefore intended to be embraced by the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method, of fabricating a device isolation structure for a semiconductor device, comprising:

forming plural dummy active regions adjacent to at least one active region of a semiconductor substrate of the semiconductor device; and filling trenches located between each dummy active region and between an outer dummy active region and the active region adjacent thereto with a filling layer; the method further comprising:

sequentially forming a first insulation layer and a first conduction layer on the semiconductor substrate in which a field isolation region and an active region are defined, the field isolation region including a plurality of dummy active regions;

etching and patterning the first insulation layer and the first conduction layer to form a mask and to expose an upper portion of the semiconductor substrate on which a plurality of trenches will be formed;

forming the plurality of trenches by etching the exposed semiconductor substrate using the patterned first insulation layer and first conduction layer as a mask;

forming a gate insulation layer on the semiconductor substrate and the filling layer located in the plurality of trenches; and forming a second conduction layer on the gate insulation layer, N-type impurity or P-type impurity being discriminately doped by ion implantation into the second conduction layer which corresponds to the active region, wherein the filling of trenches comprises:
forming the filling layer on the first conduction layer and in the plurality of trenches;
etching the filling layer until an upper portion of the first conduction layer is exposed; and
removing the mask by removing the first insulation layer and the first conduction layer, leaving the filling layer in the trenches.

2. The method of claim 1, wherein the filling layer is composed of at least one of a silicon oxidation layer, a boron phosphorous silicate glass (BPSG), a borosilicate glass (BSG), a phosphosilica glass (PSG).

3. The method of claim 1, further comprising:
forming a co-salicide layer on the second conduction layer that functions as a self-aligning silicide layer.

4. The method of claim 3, wherein forming the co-salicide layer includes forming and annealing a cobalt layer on the second conduction layer.

5. The method of claim 3, wherein the second conduction layer is composed of an undoped polycrystalline silicon, thereby obtaining low parasitic capacitance.

6. The method of claim 3, wherein an identical N-type impurity or an identical P-type impurity is ion-implanted into the second conduction layer which corresponds to the active region.

* * * * *

UNITED STATES PATENT AND TRADEMARK OFFICE
CERTIFICATE OF CORRECTION

PATENT NO.   : 6,337,254 B1
DATED        : January 8, 2002
INVENTOR(S)  : Jae-Gyung Ahn It is certified that error appears in the above-identified patent and that said Letters Patent is hereby corrected as shown below:

<u>Title page,</u>
Item [30], Foreign Application Priority Data, please correct the Korean application number from "98-280886" to -- 98-20886 --.

Signed and Sealed this

First Day of October, 2002

*Attest:*

*Attesting Officer*

JAMES E. ROGAN
*Director of the United States Patent and Trademark Office*